United States Patent
Hayn

(10) Patent No.: US 7,777,195 B2
(45) Date of Patent: Aug. 17, 2010

(54) CHARGED PARTICLE BEAM INSTRUMENT AND METHOD OF DETECTING CHARGED PARTICLES

(75) Inventor: Armin Heinz Hayn, Saffron Walden (GB)

(73) Assignee: Carl Zeiss SMT Limited (GB)

( * ) Notice: Subject to any disclaimer, the term of this patent is extended or adjusted under 35 U.S.C. 154(b) by 291 days.

(21) Appl. No.: 11/857,813

(22) Filed: Sep. 19, 2007

(65) Prior Publication Data

US 2008/0078934 A1    Apr. 3, 2008

(30) Foreign Application Priority Data

Sep. 23, 2006   (GB)   ................... 0618770.2

(51) Int. Cl.
*H01J 3/26*   (2006.01)

(52) U.S. Cl. ................ 250/399; 250/306; 250/307; 250/310; 250/311; 250/396 R; 250/396 ML; 250/398

(58) Field of Classification Search ............ 250/306, 250/307, 310, 311, 396 R, 396 ML, 397, 250/398, 399
See application file for complete search history.

(56) References Cited

U.S. PATENT DOCUMENTS

| | | | |
|---|---|---|---|
| 4,893,009 | A | 1/1990 | Kuroda |
| 6,201,240 | B1 | 3/2001 | Dotan |
| 2002/0166966 | A1 | 11/2002 | Ogawa |
| 2003/0010913 | A1 | 1/2003 | Essers |
| 2005/0035292 | A1 * | 2/2005 | Adamec et al. ............. 250/310 |

FOREIGN PATENT DOCUMENTS

| | | |
|---|---|---|
| EP | 1049132 A1 | 11/2000 |
| GB | 2081501 A1 | 2/1982 |
| JP | 2001/338600 A | 12/2001 |

OTHER PUBLICATIONS

EPO Search Report dated Mar. 3, 2010 in EP 07253731.9.

* cited by examiner

*Primary Examiner*—Jack I Berman
*Assistant Examiner*—Hanway Chang
(74) *Attorney, Agent, or Firm*—Barnes & Thornburg LLP

(57) ABSTRACT

A charged particle beam instrument (10) is provided, the instrument comprising a charged particle optical column (12), a voltage source, a detector (14) and a sample holder (18), the column (12) being operable to direct a beam of primary charged particles at a sample (20) on the sample holder (18) to cause secondary charged particles to be released from the sample, the voltage source being operable to establish in the vicinity of the sample an electric field that has a component that draws the secondary charged particles towards the detector (14), and the detector being operable to detect secondary charged particles, wherein the instrument further comprises a further voltage source (16) variable between a first voltage that establishes a component of the electric field that draws the secondary charged particles away from the sample, so as to prevent at least some of them from colliding with the sample (20) or sample holder (18), and a second voltage that establishes a component of the electric field that draws the secondary charged particles towards the sample, so as to prevent at least some of them from colliding with the column (12), thereby increasing the number of secondary charged particles detected by the detector (14).

18 Claims, 7 Drawing Sheets

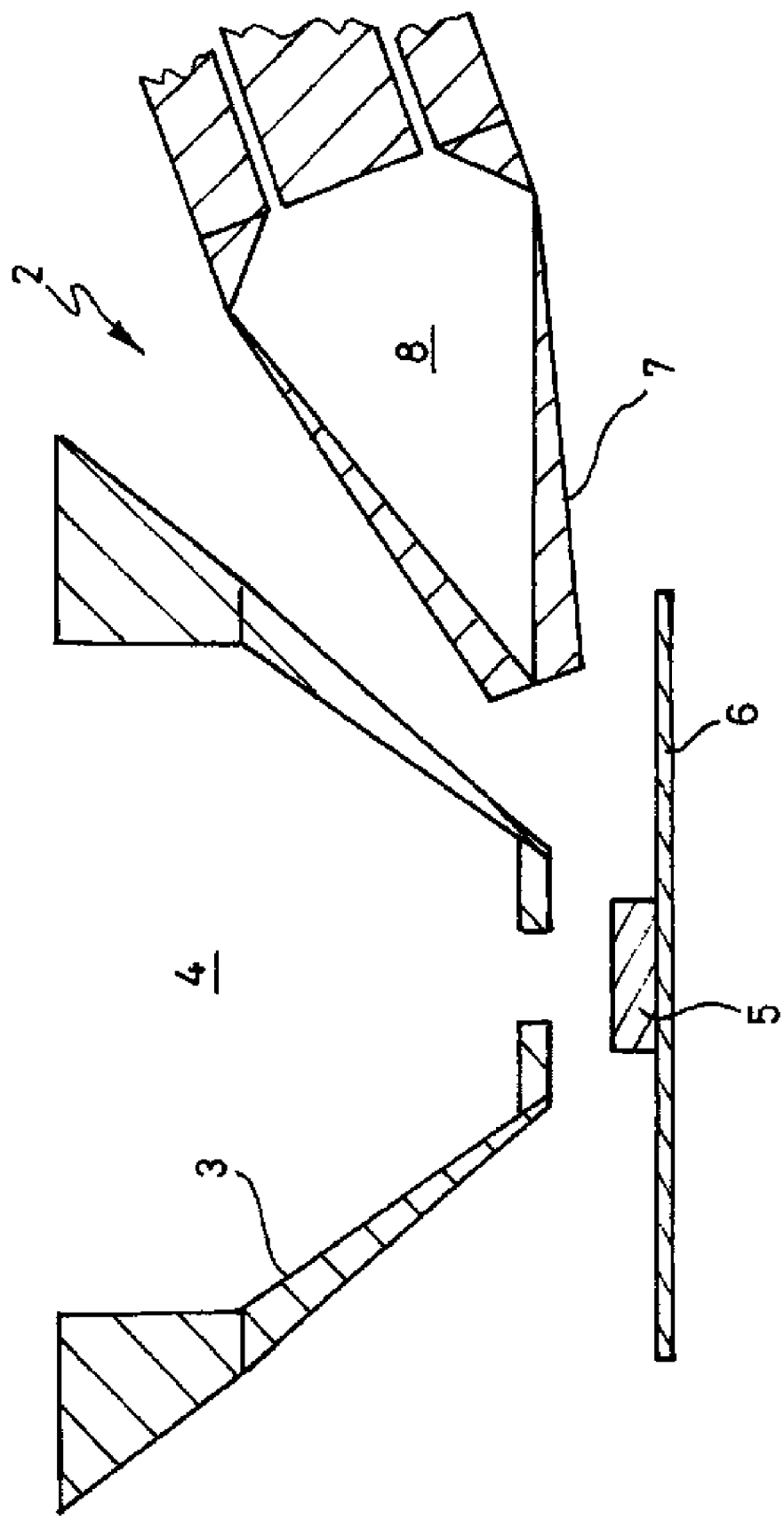

CHARGED PARTICLE BEAM INSTRUMENT AND METHOD OF DETECTING CHARGED PARTICLES

FIELD OF THE INVENTION

This invention relates to a charged particle beam instrument, in particular a scanning electron microscope (SEM), and to a method of detecting charged particles released from a sample in such an instrument.

BACKGROUND TO THE INVENTION

A known scanning electron microscope (SEM) comprises an electron optical column, a voltage source, an Everhart-Thornley detector and a sample holder, the column being operable to direct a beam of primary electrons at a sample on the sample holder to cause secondary electrons to be released from the sample, the voltage source being operable to establish in the vicinity of the sample an electric field that has a component that draws the secondary electrons towards the detector, and the detector being operable to detect some of the secondary electrons.

A key feature of the SEM is its resolution. In general the smallest spot size (spot size is the diameter of the beam of primary electrons at the surface of the sample) is obtainable at short working distances. (Working distance is the distance from the sample to an end of an objective lens of the column nearer to the sample) because the aberration coefficients decrease with decreasing working distance provided that the optimum semi angle can be maintained. (The semi angle is an angle included by a tip of a cone formed as the beam of primary electrons is focused at the surface of the sample). The SEM is therefore typically used at short working distances.

However, the number of secondary electrons that are detected by the detector also decreases at short working distances because the secondary electrons are shielded from the electric field by the sample holder and a pole piece of the objective lens of the column.

As most of the secondary electrons have kinetic energies from only 2 eV to 5 eV a strong magnetic field of the objective lens of the column forces most of the secondary electrons to spiral up the column, especially at higher beam energies, or to collide with the sample, sample holder or column, resulting in a further reduction in the number of secondary electrons detected by the detector.

SUMMARY OF THE INVENTION

According to a first aspect of the invention there is provided a charged particle beam instrument comprising a charged particle optical column, a voltage source, a detector and a sample holder, the column being operable to direct a beam of primary charged particles at a sample on the sample holder to cause secondary charged particles to be released from the sample, the voltage source being operable to establish in the vicinity of the sample an electric field that has a component that draws the secondary charged particles towards the detector, and the detector being operable to detect secondary charged particles, wherein the instrument further comprises a further voltage source variable between a first voltage that establishes a component of the electric field that draws the secondary charged particles away from the sample, so as to prevent at least some of them from colliding with the sample or sample holder, and a second voltage that establishes a component of the electric field that draws the secondary charged particles towards the sample, so as to prevent at least some of them from colliding with the column, thereby increasing the number of secondary charged particles detected by the detector.

The invention can provide a charged particle beam instrument that is capable of detecting more of the secondary charged particles than the known instrument, because at least some of the secondary charged particles, which would otherwise collide with the sample, sample holder or column before being detected by the detector, are prevented from so colliding by the component of the electric field established by the further voltage source.

Typically the further voltage source would be operated at the first voltage when the behaviour of the secondary charged particles is determined predominantly by a magnetic field of an objective lens of the column, so as to prevent at least some of the secondary charged particles from colliding with the sample or the sample holder, and would be operated at the second voltage when the behaviour of the secondary charged particles is determined predominantly by the electric field, so as to prevent at least some of the secondary charged particles from colliding with the column.

The charged particle optical column is preferably an electron optical column.

In preferred embodiments of the invention the charged particle beam instrument is a scanning electron microscope (SEM) of which the charged particle optical column is an electron optical column operable to direct a beam of primary electrons at the sample to cause secondary electrons to be released from the sample.

The detector may advantageously be operable to detect some of the secondary charged particles by responding to photons that collide with it, the photons being generated as a result of collisions between some of the secondary charged particles and gas molecules between the sample holder and the detector.

Alternatively or additionally, the detector may advantageously be operable to detect some of the secondary charged particles by responding to those of the secondary charged particles that collide with it.

The voltage source may advantageously form part of the detector.

In the preferred embodiments the detector is located outside the electron optical column at the side of a pole piece of an objective lens of the column.

In the preferred embodiments of the invention the detector is an Everhart-Thornley detector.

The further voltage source is preferably continuously variable between the first and second voltages.

When the beam of primary charged particles is directed at the sample, the secondary charged particles are released at a wide range of angles to the surface of the sample, from nearly parallel to perpendicular to the surface. A component of the electric field of a magnitude that prevents some of the secondary charged particles released at an angle of, say, 60° to the surface of the sample from colliding with the column may cause secondary charged particles released at an angle of, say, 30° to the surface of the sample to collide with the sample or sample holder.

Conversely, a component of the electric field of a magnitude that prevents some of the secondary charged particles released at an angle of 30° to the surface of the sample from colliding with the column without causing them to collide with the sample may not prevent the secondary charged particles released at an angle of 60° to the surface of the sample from colliding with the column.

Where the further voltage source is continuously variable between the first and second voltages, a user of the instrument can set the voltage of the further voltage source so as to establish a component of the electric field that prevents at least some of the secondary charged particles released at a particular angle or range of angles to the surface of the sample from colliding with the sample, sample holder or column.

Typically the user would set the voltage of the further voltage source so as to establish a component of the electric field that prevents at least some of the secondary charged particles released at an angle or range of angles to the surface of the sample at which the largest number of secondary charged particles are released from the sample from colliding with the sample, sample holder or column. It is believed that the greatest increase in the number of secondary charged particles detected by the detector can be obtained in this way.

Alternatively the user could set the voltage of the further voltage source so as to establish a component of the electric field that enables at least some of the secondary charged particles released at an angle or range of angles to the surface of the sample that would otherwise cause them to collide with the sample, sample holder or column to be detected by the detector. It is believed that information relating to the sample that can not be obtained using the known instrument can be obtained in this way.

Where the further voltage source is continuously variable between the first and second voltages, the instrument may advantageously include a controller operable to vary the voltage of the further voltage source between the first and second voltages so as to maximise an output of the detector.

The column includes magnetic coils for generating a magnetic field inside the column to focus and scan the beam of primary charged particles relative to the surface of the sample. Leakage of magnetic flux from the objective lens of the column causes the magnetic field to extend outside the objective lens of the column in the vicinity of the sample. The magnetic field causes the secondary charged particles to describe spirals.

The strength of the magnetic field required to focus and scan the beam of primary charged particles depends on the kinetic energy of the charged particles that constitute the beam. For a beam of primary charged particles with a relatively high kinetic energy, a relatively strong magnetic field is required, whereas for a beam of primary charged particles with a relatively low kinetic energy, a relatively weak magnetic field is required. The strength of the magnetic field in the vicinity of the sample thus depends on the kinetic energy of the primary charged particles.

For a secondary charged particle with a particular kinetic energy, the diameter of the spiral described by the charged particle is inversely proportional to the strength of the magnetic field.

Thus, where the primary charged particles have a relatively high kinetic energy, the magnetic field in the vicinity of the sample is relatively strong and the secondary charged particles describe spirals of relatively small diameter.

A secondary charged particle that is released from the sample at a small angle to the surface of the sample into a relatively strong magnetic field may spiral into the sample or sample holder. Such a secondary charged particle can be prevented from spiralling into the sample or sample holder by a component of the electric field that draws the secondary charged particle away from the sample.

Where, on the other hand, the primary charged particles have a relatively low kinetic energy, the magnetic field in the vicinity of the sample is relatively weak and the secondary charged particles describe spirals of relatively large diameter.

A secondary charged particle that is released from the sample at a large angle to the surface of the sample into a relatively weak magnetic field may spiral into the column. Such a secondary charged particle can be prevented from spiralling into the column by a component of the electric field that draws the secondary charged particle towards the sample.

The further voltage source can therefore be used to prevent at least some of the secondary charged particles from colliding with the sample, sample holder or column both with a beam constituted by primary charged particles with a relatively low kinetic energy and with a beam constituted by primary charged particles with a relatively high kinetic energy.

Moreover, the further voltage source can prevent at least some of the secondary charged particles from colliding with the sample, sample holder or column for a wide variety of conditions of kinetic energy of the primary charged particles, kinetic energy of the secondary charged particles and angle to the surface of the sample at which the secondary charged particles are released.

It is believed, as a result of mathematical modelling, and assuming a mean kinetic energy of the secondary charged particles of 3 eV, that an increase of over 50 percent in the number of secondary charged particles that are detected by the detector is possible using an instrument in accordance with the first aspect of the invention.

In the preferred embodiment of the invention the further voltage source is variable over a range of 50V.

The further voltage source may advantageously be connected to an electrode located between the objective lens of the column and the sample holder.

The electrode may advantageously be formed with an aperture and be located relative to the objective lens such that the beam of primary charged particles may be directed through the electrode at the sample.

Preferably the aperture is substantially circular and the electrode is located relative to the objective lens such that the optical axis of the column passes through the centre of the aperture.

This configuration of the electrode is advantageous because the components of the electric field due to the electrode are substantially symmetrical about the optical axis of the column. The components of the electric field due to the electrode therefore do not cause astigmatism of the beam of primary charged particles (astigmatism is a deformation of the beam that causes the beam to be non-circular at the sample), which might otherwise be expected to result from an electrode located between the column and the sample, particularly in the case of a beam of charged particles with a relatively low kinetic energy.

Alternatively or additionally, the further voltage source may advantageously be connected to the objective lens of the column and/or the sample holder.

Although it is envisaged that the further voltage source could be connected to both the objective lens and the sample holder, typically it would be connected to one or the other.

Where the further voltage source is connected to the objective lens, the sample holder would typically be connected to electrical ground, and where the further voltage source is connected to the sample holder, the objective lens would typically be connected to electrical ground.

In the preferred embodiment of the invention the further voltage source is connected to the sample holder, the objective lens is connected to electrical ground, and the further voltage source is variable between +25V and −25V.

According to a second aspect of the invention there is provided a method of detecting charged particles, the method comprising the steps of directing a beam of primary charged particles from a charged particle optical column at a sample to cause secondary charged particles to be released from the sample, establishing in the vicinity of the sample an electric field that has a component that draws the secondary charged particles towards a detector, and detecting at least some of the secondary charged particles by means of the detector, wherein the method further comprises the step of increasing the number of secondary charged particles detected by the detector by establishing a component of the electric field that draws the secondary charged particles away from the sample, so as to prevent at least some of them from colliding with the sample, or that draws the secondary charged particles towards the sample, so as to prevent at least some of them from colliding with the column.

The step of establishing the component of the electric field that draws the secondary charged particles away from or towards the sample may advantageously comprise establishing a component of the electric field that draws the secondary charged particles away from the sample where the behaviour of the secondary charged particles is determined predominantly by a magnetic field of an objective lens of the column, and establishing a component of the electric field that draws the secondary charged particles towards the sample where the behaviour of the secondary charged particles is determined predominantly by the electric field.

Alternatively or additionally, the step of establishing the component of the electric field that draws the secondary charged particles away from or towards the sample may advantageously comprise determining the magnitude and direction of the component according to an angle or range of angles to the surface of the sample at which at least some of the secondary charged particles are released, to a kinetic energy of the primary charged particles of the beam and/or to a kinetic energy or range of kinetic energies of the secondary charged particles.

BRIEF DESCRIPTION OF THE DRAWING FIGURES

The invention will now be described by way of illustrative example and with reference to the accompanying drawings, in which:

FIG. 1 is a partial schematic sectional view of a scanning electron microscope (SEM) that forms the basis of a mathematical model used to predict the performance of an SEM in accordance with the first aspect of the invention;

Figure 2:
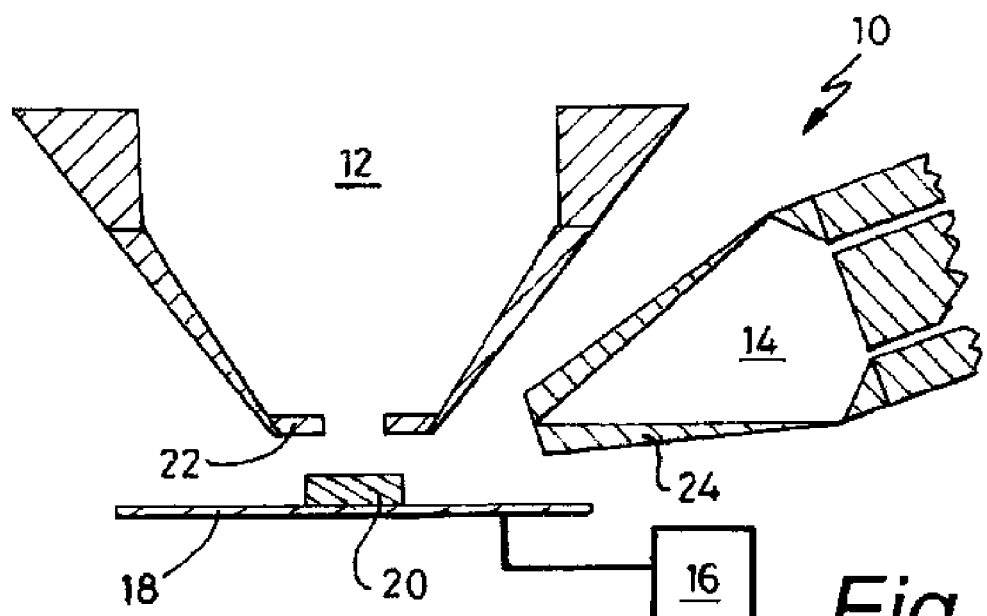
FIG. 2 is a partial schematic sectional view of a second SEM in accordance with the first aspect of the invention.
Figure 9:
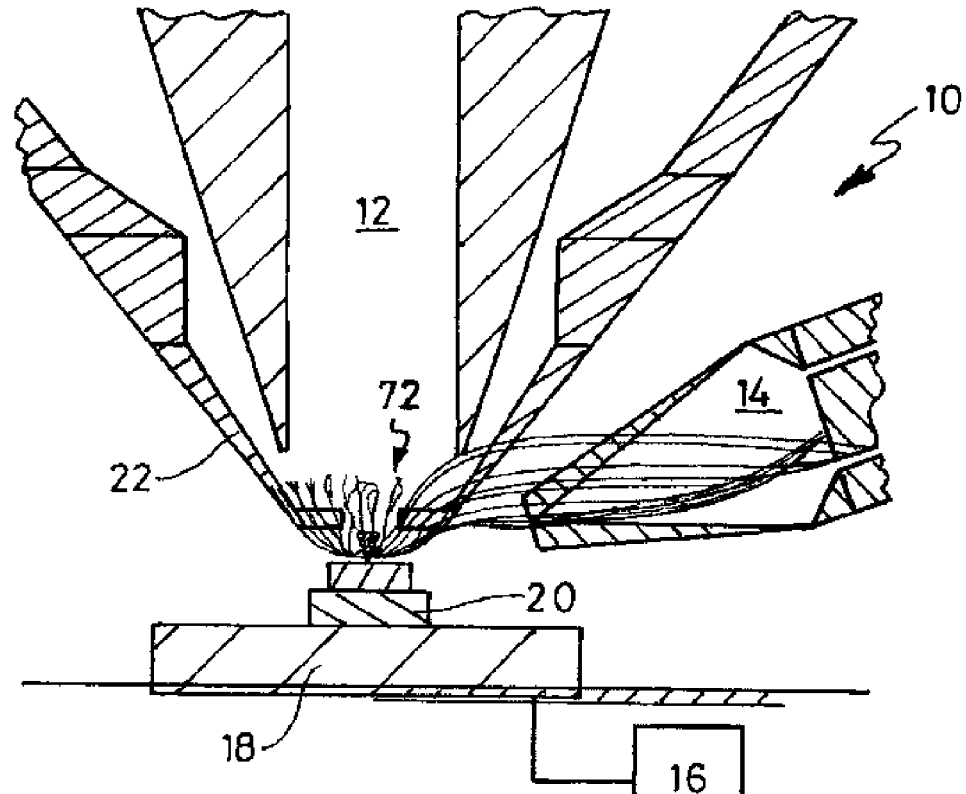
Figure 10:
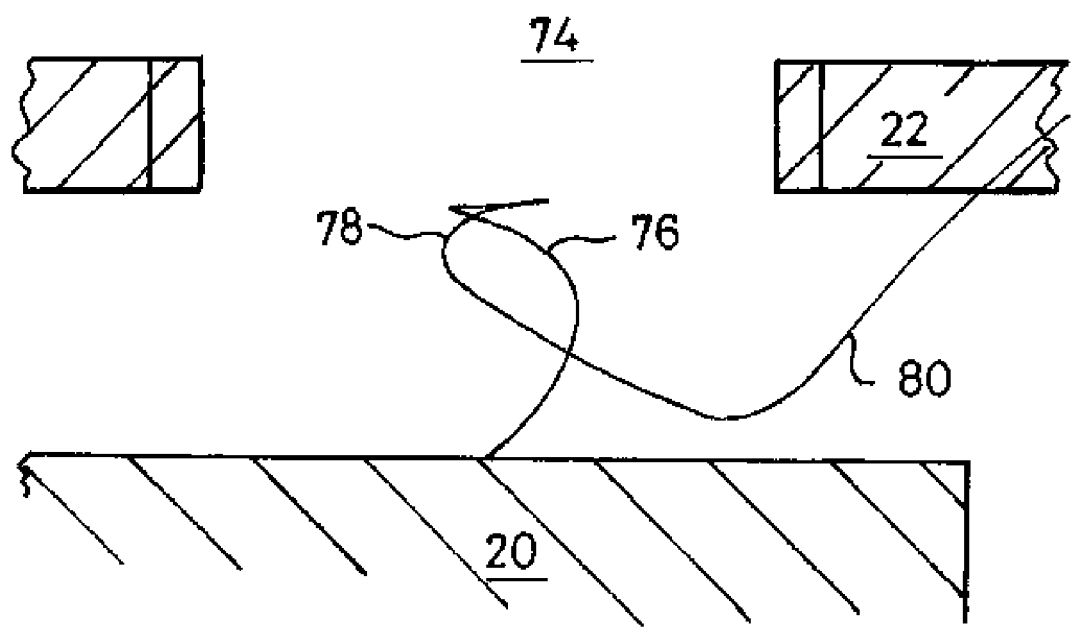

FIG. 9 is a partial schematic sectional view of the SEM of FIG. 2 in use with a beam of primary electrons with a kinetic energy of approximately 30 keV and a voltage of −20V applied by the further voltage source to the sample holder on which the sample rests, and shows the paths of secondary electrons released from the sample at an angle of 45° to the surface of the sample; and FIG. 10 is a detail of FIG. 9 showing the path of one of the secondary electrons.

DETAILED DESCRIPTION OF AN EMBODIMENT

FIG. 1 shows a portion 2 of a Carl Zeiss EVO scanning electron microscope (SEM). The portion 2 includes a pole piece 3 of an objective lens of an electron optical column 4, a sample 5 resting on a sample holder 6, and an accelerating electrode 7 of an Everhart-Thornley secondary electron detector 8. The detector 8 is located outside the column 4 and to the side of the pole piece 3 of the objective lens of the column 4.

The following equations are used to model the motion of electrons in the electric and magnetic fields (non relativistic) in the SEM:

$$-e \cdot (\vec{v} \times \vec{B}) - e \cdot \vec{E} = m \cdot \vec{a}$$

$$\frac{d^2}{dt^2}x = \frac{e}{m} \cdot \left(E_x + \frac{dy}{dt} \cdot B_z - \frac{dz}{dt} \cdot B_y\right)$$

$$\frac{d^2}{dt^2}y = \frac{e}{m} \cdot \left(E_y + \frac{dz}{dt} \cdot B_x - \frac{dx}{dt} \cdot B_z\right),$$

$$\frac{d^2}{dt^2}z = \frac{e}{m} \cdot \left(E_z + \frac{dx}{dt} \cdot B_y - \frac{dy}{dt} \cdot B_x\right)$$

where e is the charge on an electron, v is the velocity of the electron, B is the magnetic flux density, E is the electrostatic field strength, m is the mass of the electron, a is the acceleration of the electron, and t denotes time and x, y and z the components of the velocity, magnetic flux density, electrostatic field strength and acceleration.

Since analytical solution of these equations is not possible for most of the fields encountered in the SEM, for the purposes of the model they are solved numerically by the finite difference element method.

Applying Lambert's cosine law for the angular distribution of the secondary electron emission from the sample, the following equation is used to model the total number of secondary electrons emitted from the sample:

$$n_{emitted\ SE} = \int_\Omega \frac{dn}{d\Omega'} d\Omega' = \int_{\theta_1}^{\theta_n} \int_{\theta_1}^{\varphi_n} \frac{n_{total\ emitted\ SE}}{\pi} \cdot \cos\theta' \cdot \sin\theta' \cdot d\theta' \cdot d\varphi'$$

$$= 2\pi \frac{n_{total\ emitted\ SE}}{\pi} \cdot \int_{\theta_1}^{\theta_n} \cos\theta' \cdot \sin\theta' \cdot d\theta' =$$

-continued $$= 2 \cdot n_{total\ emitted\ SE} \cdot \begin{bmatrix} \int_{\theta_1}^{\theta_1+\Delta\theta} \cos\theta' \cdot \sin\theta' \cdot d\theta' + \\ \int_{\theta_1+\Delta\theta}^{\theta_1+2\Delta\theta} \cos\theta' \cdot \sin\theta' \cdot d\theta' + \\ \ldots + \int_{\theta_{n-1}}^{\theta_n} \cos\theta' \cdot \sin\theta' \cdot d\theta' \end{bmatrix} =$$

$$= 2 \cdot n_{total\ emitted\ SE} \cdot \frac{1}{2} \begin{bmatrix} \sin^2(\theta_1+\Delta\theta) - \sin^2(\theta_1) + \\ \sin^2(\theta_1+2\Delta\theta) - \sin^2(\theta_1+\Delta\theta) + \\ +\ldots \sin^2(\theta_n) - \sin^2(\theta_n - \Delta\theta) \end{bmatrix} =$$

$$= \Delta n_{1\ emitted\ SE} + \Delta n_{2\ emitted\ SE} + \ldots + \Delta n_{n\ emitted\ SE}$$

where $\theta$ is the polar angle of emission of a secondary electron relative to the surface of the sample, $\phi$ is the angle of emission of the secondary electron relative to the secondary electron detector, and:

$$\Delta n_{i\ emitted\ SE}(\theta_i + \Delta\theta) = n_{total\ emitted\ SE} \cdot \sin^2(\theta_i + \Delta\theta) - \sin^2(\theta_i).$$

The number of detected electrons is given by:

$$n_{detected\ SE} = \Delta n_{1\ detected\ SE} + \Delta n_{2\ detected\ SE} + \ldots + \Delta n_{n\ detected\ SE}.$$

These formulae are exact for $\Delta\phi \to d\phi$ and $\Delta\theta \to d\theta$.

The model is used to determine whether secondary electrons released at an angle of $\phi=0°$ to the secondary electron detector and $\theta=0, 5, 10, \ldots, 85, 90°$ to the surface of the sample reach the detector, then whether secondary electrons released at an angle of $\phi=10°$ and $\theta=0, 5, 10, \ldots, 85, 90°$ reach the detector, and so on up to $\phi=350°$. Using $\Delta\theta=5°$ and $\Delta\phi=10°$, as explained above, and without taking Lambert's cosine law into account, the behaviour of 684 secondary electrons (19 values of $\Delta\theta$ multiplied by 36 values of $\Delta\phi$) is modelled.

Table 1 below sets out the total number of secondary electrons emitted for $\theta=0, 5, 10, \ldots, 85, 90°$, taking Lambert's cosine law into account.

TABLE 1

| NUMBER OF EMITTED SE (MODEL) | $\theta$ [in °] | NUMBER OF EMITTED SE INCLUDING LAMBERT'S COSINE LAW $\Delta n_{i\ emitted\ SE}(\theta_i + \Delta\theta) = 36 \cdot (\sin^2(\theta_i + \Delta\theta) - \sin^2(\theta_i))$ |
|---|---|---|
| 36 | 90 | 0.27 |
| 36 | 85 | 0.81 |
| 36 | 80 | 1.33 |
| 36 | 75 | 1.80 |
| 36 | 70 | 2.22 |
| 36 | 65 | 2.57 |
| 36 | 60 | 2.84 |
| 36 | 55 | 3.03 |
| 36 | 50 | 3.13 |
| 36 | 45 | 3.13 |
| 36 | 40 | 3.03 |
| 36 | 35 | 2.84 |
| 36 | 30 | 2.57 |
| 36 | 25 | 2.22 |
| 36 | 20 | 1.80 |
| 36 | 15 | 1.33 |
| 36 | 10 | 0.81 |
| 36 | 5 | 0.27 |
| 36 | 0 | 0 |

It will be appreciated that when modelling the SEM it is assumed that only one secondary electron is emitted for each combination of values of $\theta$ and $\phi$. Once the effect of Lambert's cosine law has been included in the model this results in a non-integral value for the number of secondary electrons emitted from the sample at each value of $\theta$. Of course, the number of secondary electrons emitted at any combination of values of $\theta$ and $\phi$ in an actual SEM would be several orders of magnitude greater than one, and determined by a statistical distribution, giving rise to an integral number of secondary electrons. This does not undermine the usefulness of the model, however, which is concerned only with ratios of numbers of secondary electrons detected under different conditions.

It will also be appreciated that the secondary electrons are released from the sample with a wide range of kinetic energies, and that the model could be improved by integrating the equation used to model the total number of secondary electrons released from the sample with respect to the kinetic energy of the secondary electrons over the range of kinetic energies at which the secondary electrons are released from the sample, according to the equation:

$$n_{emitted\ SE} = \int_E \int_\Omega \frac{dn}{d\Omega'} \cdot \frac{dn}{dE'} d\Omega dE'.$$

However, since the number of secondary electrons released from the sample with each value of kinetic energy i.e.

$$\frac{dn}{dE'}$$

is unknown, as an approximation it is assumed that the secondary electrons are released from the sample with a mean kinetic energy of 3 eV.

It is assumed for the purposes of the model that the distance from the centre of the aperture of the pole piece 3 of the objective lens of the column 4 to the centre of the end of the accelerating electrode 7 is about 19 mm.

Table 2 below sets out the total number of secondary electrons detected by the detector 8 with voltages of 0, −5, −10, −15 and −20V applied to the sample holder 6. The model assumes a beam energy (i.e. kinetic energy of the primary electrons) of 30 keV, a kinetic energy of the secondary electrons of 2 eV, a magnetic field of the objective lens of the column corresponding to that which would focus a beam starting at 246 mm from an end of the pole piece nearer to the sample, a voltage of +400V applied to the accelerating electrode 7 of the detector 8 and the pole piece 3 of the objective lens of the column connected to electrical ground. The last row but one of the table gives the percentage detection efficiency of the detector, for each of the voltages applied to the sample holder, calculated from the total number of secondary electrons emitted from the sample, while the last row of the table gives the percentage improvement in detection efficiency of the detector for each of the voltages applied to the sample holder when compared with a voltage of 0V applied to the sample holder. The effect of Lambert's cosine law is already included in the number of emitted secondary electrons and hence in the number of detected secondary electrons.

TABLE 2

| θ [in °] | SAMPLE BIAS: | | | | |
|---|---|---|---|---|---|
| | 0 V NUMBER OF DETECTED SE | −5 V NUMBER OF DETECTED SE | −10 V NUMBER OF DETECTED SE | −15 V NUMBER OF DETECTED SE | −20 V NUMBER OF DETECTED SE |
| 90 | 0 | 0 | 0 | 0 | 0 |
| 85 | 0 | 0 | 0 | 0 | 0 |
| 80 | 0 | 0 | 0 | 0 | 0 |
| 75 | 0 | 0 | 0 | 0 | 0 |
| 70 | 0 | 0 | 0 | 0 | 0 |
| 65 | 0 | 0 | 0 | 0 | 0 |
| 60 | 0 | 0 | 0 | 0 | 0 |
| 55 | 0 | 0 | 0 | 0 | 0 |
| 50 | 0 | 0 | 0 | 0 | 0 |
| 45 | 0 | 0 | 1.39 | 0 | 0.87 |
| 40 | 0 | 0.67 | 0 | 1.26 | 0 |
| 35 | 0 | 1.34 | 0.95 | 0 | 0 |
| 30 | 0 | 0 | 1.14 | 0.79 | 0 |
| 25 | 0 | 0 | 0.80 | 0.86 | 0.55 |
| 20 | 0.30 | 0 | 0 | 0.55 | 0.70 |
| 15 | 0.37 | 0.55 | 0 | 0.33 | 0.48 |
| 10 | 0.25 | 0.41 | 0 | 0 | 0 |
| 5 | 0.07 | 0.14 | 0.12 | 0 | 0.05 |
| 0 | 0 | 0 | 0 | 0 | 0 |
| Efficiency in %: | 2.7 | 8.6 | 12.2 | 10.5 | 7.4 |
| Improvement in %: | | 216.0 | 347.0 | 285.1 | 168.8 |

Table 3 below sets out the total number of secondary electrons detected by the detector and percentage efficiency and improvement in efficiency of the detector under the same conditions as in table 2 above but assuming a kinetic energy of the secondary electrons of 3 eV.

TABLE 3

| θ [in °] | SAMPLE BIAS: | | | | |
|---|---|---|---|---|---|
| | 0 V NUMBER OF DETECTED SE | −5 V NUMBER OF DETECTED SE | −10 V NUMBER OF DETECTED SE | −15 V NUMBER OF DETECTED SE | −20 V NUMBER OF DETECTED SE |
| 90 | 0 | 0 | 0 | 0 | 0 |
| 85 | 0 | 0 | 0 | 0 | 0 |
| 80 | 0 | 0 | 0 | 0 | 0 |
| 75 | 0 | 0 | 0 | 0 | 0 |
| 70 | 0 | 0 | 0 | 0 | 0 |
| 65 | 0 | 0 | 0 | 0 | 0 |
| 60 | 0 | 0 | 0 | 0 | 0 |
| 55 | 0 | 0 | 0 | 0.93 | 0 |
| 50 | 0 | 0 | 0.26 | 0.43 | 0 |
| 45 | 0 | 0.96 | 0 | 0 | 1.13 |
| 40 | 0 | 0 | 1.26 | 0.59 | 0 |
| 35 | 0 | 0 | 0 | 1.11 | 1.18 |
| 30 | 0.21 | 0 | 0 | 0 | 0.93 |
| 25 | 0.68 | 0.86 | 0 | 0 | 0 |
| 20 | 0.70 | 0.80 | 0.80 | 0 | 0 |
| 15 | 0.55 | 0.59 | 0.55 | 0.55 | 0 |
| 10 | 0.34 | 0.36 | 0.34 | 0.32 | 0.34 |
| 5 | 0.09 | 0.12 | 0.11 | 0.11 | 0.11 |
| 0 | 0 | 0 | 0 | 0 | 0 |
| Efficiency in %: | 7.1 | 10.2 | 9.2 | 11.2 | 10.2 |
| Improvement in %: | | 43.3 | 29.3 | 56.6 | 43.2 |

By way of explaination, the figure of 0.677913 in table 3 above for the number of detected secondary electrons released from the sample at an angle of 25° to the surface of the sample with a voltage of 0V applied to the sample holder is calculated as follows:

$$\Delta n_{detected\ SE}(25°) = 11 \cdot (\sin^2(25°) - \sin^2(20°)) = 0.677913,$$

where the number "11" is the number of detected electrons (out of 36) calculated by the model.

Table 4 sets out the total number of secondary electrons detected by the detector and percentage efficiency and improvement in efficiency under the same conditions as in tables 2 an 3 above but assuming a kinetic energy of the secondary electrons of 4 eV.

TABLE 4

| θ [in °] | SAMPLE BIAS: | | | | |
|---|---|---|---|---|---|
| | 0 V NUMBER OF DETECTED SE | −5 V NUMBER OF DETECTED SE | −10 V NUMBER OF DETECTED SE | −15 V NUMBER OF DETECTED SE | −20 V NUMBER OF DETECTED SE |
| 90 | 0 | 0 | 0 | 0 | 0 |
| 85 | 0 | 0 | 0 | 0 | 0 |
| 80 | 0 | 0 | 0 | 0 | 0 |
| 75 | 0 | 0 | 0 | 0 | 0 |
| 70 | 0 | 0 | 0 | 0 | 0 |
| 65 | 0 | 0 | 0 | 0 | 0 |
| 60 | 0 | 0 | 0 | 0 | 0 |
| 55 | 0 | 0 | 0 | 0 | 0 |
| 50 | 0 | 0 | 0 | 0 | 1.30 |
| 45 | 0 | 0 | 1.30 | 0.96 | 0 |
| 40 | 0 | 0 | 0 | 1.18 | 1.18 |
| 35 | 0 | 0 | 0 | 0 | 1.18 |
| 30 | 0.86 | 1.21 | 0 | 0 | 0 |
| 25 | 1.05 | 0.99 | 0.92 | 0.92 | 0 |
| 20 | 0.85 | 0.80 | 0.75 | 0.75 | 0.70 |
| 15 | 0.63 | 0.59 | 0.52 | 0.52 | 0.48 |
| 10 | 0.38 | 0.36 | 0.29 | 0.29 | 0.29 |
| 5 | 0.10 | 0.11 | 0.10 | 0.07 | 0.09 |
| 0 | 0 | 0 | 0 | 0 | 0 |
| Efficiency in %: | 10.7 | 11.3 | 10.8 | 13.0 | 14.5 |
| Improvement in %: | | 5.2 | 0.6 | 21.3 | 35.4 |

Table 5 below sets out the total number of secondary electrons detected by the detector and percentage efficiency and improvement in efficiency (if any) under the same conditions as in tables 2 to 4 above but assuming a kinetic energy of the secondary electrons of 5 eV.

TABLE 5

| θ [in °] | SAMPLE BIAS: | | | | |
|---|---|---|---|---|---|
| | 0 V NUMBER OF DETECTED SE | −5 V NUMBER OF DETECTED SE | −10 V NUMBER OF DETECTED SE | −15 V NUMBER OF DETECTED SE | −20 V NUMBER OF DETECTED SE |
| 90 | 0 | 0 | 0 | 0 | 0 |
| 85 | 0 | 0 | 0 | 0 | 0 |
| 80 | 0 | 0 | 0 | 0 | 0 |
| 75 | 0 | 0 | 0 | 0 | 0 |
| 70 | 0 | 0 | 0 | 0 | 0 |
| 65 | 0 | 0 | 0 | 0 | 0 |
| 60 | 0 | 0 | 0 | 0 | 0 |
| 55 | 0 | 0 | 0 | 0 | 0.51 |
| 50 | 0 | 0 | 1.13 | 0 | 0 |
| 45 | 0 | 0 | 0 | 1.22 | 1.22 |
| 40 | 0 | 0 | 0 | 0 | 1.01 |
| 35 | 0.79 | 0.87 | 0 | 0 | 0 |
| 30 | 1.21 | 1.14 | 1.07 | 1.07 | 0 |
| 25 | 1.05 | 0.99 | 0.86 | 0.86 | 0.86 |
| 20 | 0.80 | 0.75 | 0.70 | 0.65 | 0.65 |
| 15 | 0.60 | 0.55 | 0.52 | 0.48 | 0.44 |
| 10 | 0.38 | 0.34 | 0.29 | 0.16 | 0.09 |
| 5 | 0.12 | 0.11 | 0.09 | 0 | 0 |
| 0 | 0 | 0 | 0 | 0 | 0 |
| Efficiency in %: | 13.7 | 13.2 | 13.0 | 12.3 | 13.3 |
| Improvement in %: | | −4.1 | −5.7 | −10.3 | −3.4 |

Table 6 below sets out the total number of secondary electrons detected by the detector and percentage efficiency and improvement in efficiency of the detector with voltages of 0, +1, +2, +3, +4V applied to the sample holder 6. The model assumes a beam energy of 1 keV, and a kinetic energy of the secondary electrons of 3 eV. The magnetic field of the objective lens, voltage applied to the detector and grounding of the sample holder are the same as previously.

TABLE 6

| θ [in °] | SAMPLE BIAS: | | | | |
|---|---|---|---|---|---|
| | 0 V NUMBER OF DETECTED SE | +1 V NUMBER OF DETECTED SE | +2 V NUMBER OF DETECTED SE | +3 V NUMBER OF DETECTED SE | +4 V NUMBER OF DETECTED SE |
| 90 | 0 | 0 | 0 | 0 | 0 |
| 85 | 0 | 0 | 0 | 0 | 0 |
| 80 | 0 | 0 | 0 | 0 | 0 |
| 75 | 0 | 0 | 0 | 0 | 0 |
| 70 | 0 | 0 | 0 | 0 | 0 |
| 65 | 0 | 0 | 0 | 0 | 0 |
| 60 | 0 | 1.03 | 1.26 | 1.11 | 0.79 |
| 55 | 1.52 | 1.60 | 1.85 | 1.85 | 1.26 |
| 50 | 0.87 | 1.65 | 1.74 | 1.91 | 1.65 |
| 45 | 0.69 | 1.56 | 1.74 | 1.82 | 1.91 |
| 40 | 0.93 | 1.60 | 1.68 | 1.68 | 1.77 |
| 35 | 1.26 | 1.42 | 1.58 | 1.58 | 1.58 |
| 30 | 1.29 | 1.36 | 1.36 | 1.36 | 1.21 |
| 25 | 1.05 | 1.17 | 1.17 | 1.17 | 0.80 |
| 20 | 0.90 | 0.90 | 0.90 | 0.90 | 0.45 |
| 15 | 0.66 | 0.66 | 0.66 | 0.44 | 0 |
| 10 | 0.41 | 0.41 | 0.36 | 0 | 0 |
| 5 | 0.14 | 0.14 | 0.05 | 0 | 0 |
| 0 | 0 | 0 | 0 | 0 | 0 |
| Efficiency in %: | 27.0 | 37.5 | 39.9 | 38.4 | 31.7 |
| Improvement in %: | | 39.0 | 47.9 | 42.4 | 17.7 |

As can be seem table 3, the mathematical model predicts that an SEM in accordance with the first aspect of the invention can detect nearly 57% more secondary electrons (3 eV) than the known instrument when used with a high energy primary electron beam (where the behaviour of the secondary electrons is predominantly determined by the magnetic field of the objective lens). Table 6 shows that the SEM of the invention can also detect nearly 50% more secondary electrons (3 eV) than the known instrument when used with a low energy primary electron beam (where the behaviour of the secondary electrons is predominantly determined by the component of the electric field due to the accelerating electrode of the detector).

Figure 1A:
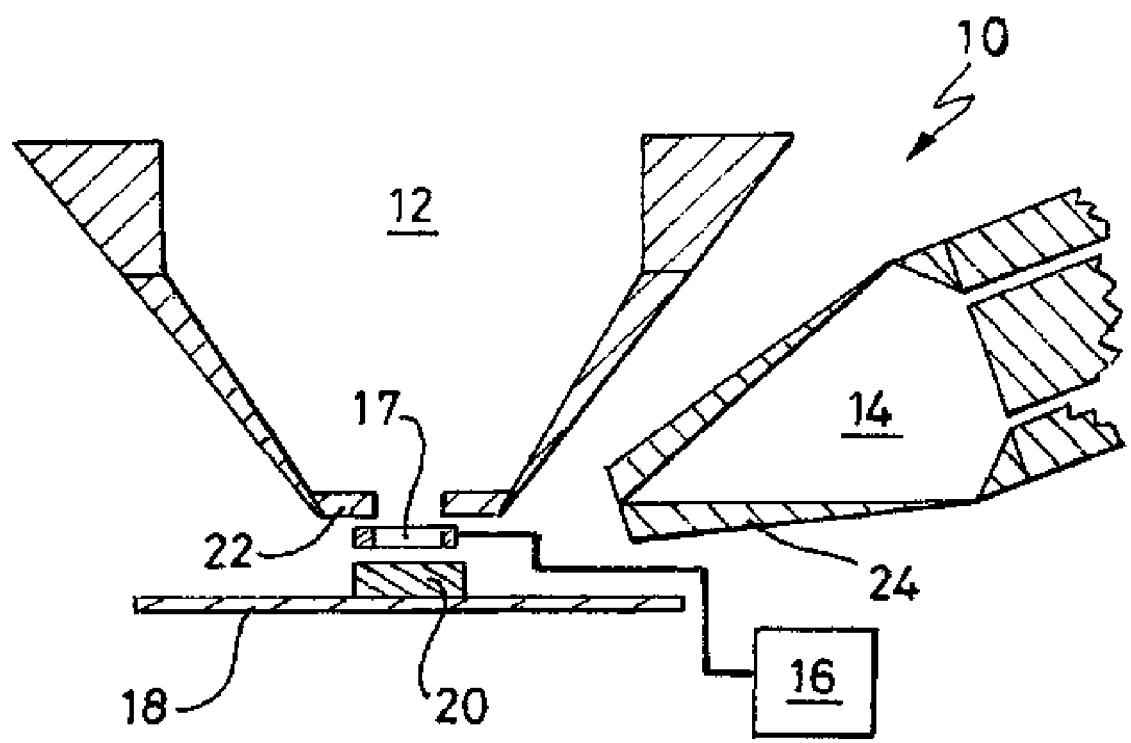
FIG. 1a is a partial schematic sectional view of a first SEM in accordance with the first aspect of the invention.

Turning to FIG. 1a, this shows a portion 10 of a first charged particle beam instrument in accordance with the first aspect of the invention in the form of an SEM. The portion 10 includes a charged particle optical column in the form of an electron optical column 12, a detector in the form of an Everhart-Thornley detector 14 and a further voltage source 16 connected to an annular electrode 17 located between a pole piece 22 of an objective lens of the electron optical column 12 and a sample holder 18 on which a sample 20 rests, the annular electrode 17 being located above the sample 20, such that a beam of primary electrons (not shown) can be directed through the annular electrode 17 at the sample 20. The column 12 also includes magnetic coils (not shown) for generating a magnetic field that focuses and scans the beam of primary electrons relative to the sample 20.

The Everhart-Thornley detector 14 includes an accelerating electrode 24 connected to a voltage source (not shown). A +400V voltage applied to the accelerating electrode 24 by the voltage source gives rise to an electric field between the sample holder 18 and the pole piece 22, which field has a component that causes secondary electrons released from the sample 20 to be drawn towards the detector 14.

The construction and operation of the column 12, Everhart-Thornley detector 14 and sample holder 18 have not been described in detail because they are the same as the construction and operation of these components in known SEMs, such as the Carl Zeiss EVO, referred to above, which will be familiar to those skilled in the charged particle beam instrument art.

The further voltage source 16 comprises +25V and −25V voltage supplies and a voltage divider connected between the voltage supplies, the voltage divider being operable to produce an output voltage in the range +/−25V. The output of the voltage divider is connected to the annular electrode 17. The pole piece 22 is connected to electrical ground.

FIG. 2 shows a portion 10 of a second SEM in accordance with the first aspect of the invention, the second SEM being identical with the first SEM except that the annular electrode is not present and the output of the voltage divider of the further voltage source 16 is connected to the sample holder 18. In FIG. 2 components common to the first and second SEMs are denoted by the same reference numerals.

Figure 3:
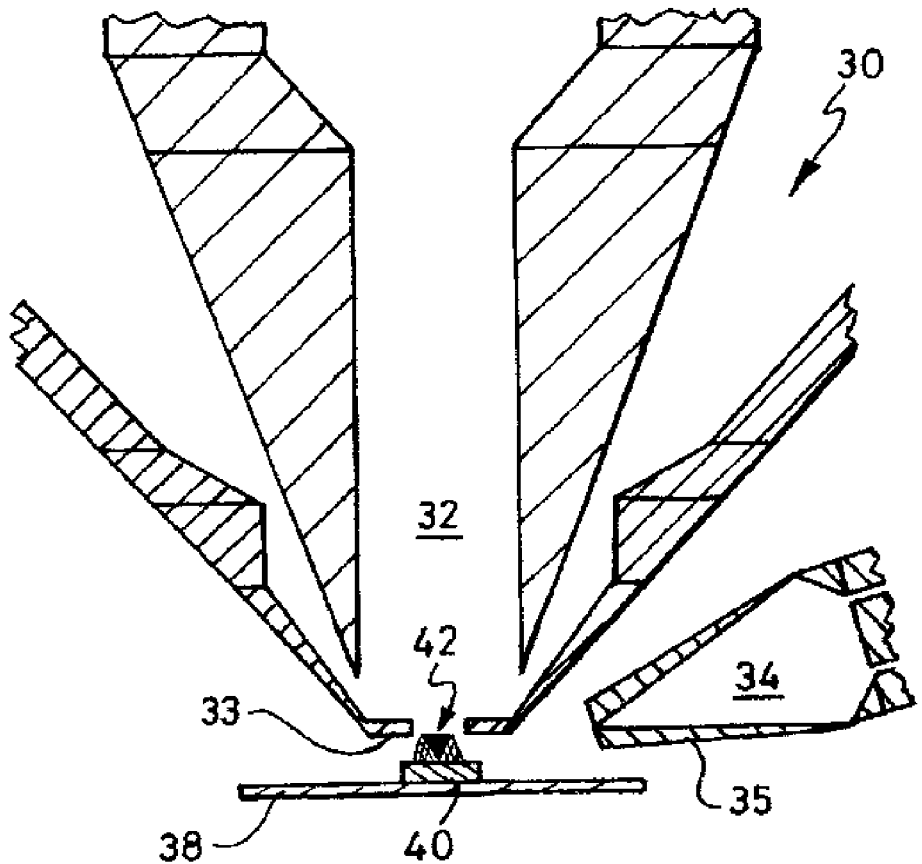
FIG. 3 is a partial schematic sectional view of a known SEM in use with a beam of primary electrons with a kinetic energy of approximately 1 keV and shows the paths of secondary electrons released from a sample at an angle of 60° to the surface of the sample.

FIG. 3 shows a portion 30 of a known SEM of similar construction to the SEM of FIG. 2, but without the further voltage source 16. The portion 30 includes a column 32, an Everhart-Thornley detector 34 and a sample holder 38 on which a sample 40 rests. The SEM of FIG. 3 is in use with a beam of primary electrons (not shown) from the column 32 directed at the sample 40. The primary electrons have a kinetic energy of approximately 1 keV. It will be appreciated that secondary electrons are released from the sample at all angles to the surface of the sample as a result of the beam of primary electrons being directed at the sample. For the purpose of clarity, however, only those secondary electrons released at an angle of 60° to the surface of the sample are shown in FIG. 3, denoted generally by reference numeral 42.

There is some leakage of magnetic flux from inside the column 32 through a pole piece 33 of an objective lens of the column 32. The leakage of the magnetic flux causes the magnetic field to extend between the pole piece 33 and the sample 40, the magnetic field being relatively strong in the immediate vicinity of the pole piece 33 and relatively weak in the immediate vicinity of the sample 40.

Secondary electrons travelling through the magnetic field between the sample 40 and the pole piece 33 of the objective lens of the column describe spirals, the diameters of the spirals being inversely proportional to the strength of the magnetic field in the region of the field through which the secondary electrons travel. Thus, in the immediate vicinity of the sample 40 the diameters of the spirals are relatively large, whereas in the immediate vicinity of the pole piece 33 the diameters of the spirals are relatively small.

At the same time, secondary electrons travelling between the sample 40 and the pole piece 33 are drawn towards the detector 34 by a component of an electric field resulting from a +400V voltage applied to an accelerating electrode 35 of the detector.

Figure 4:
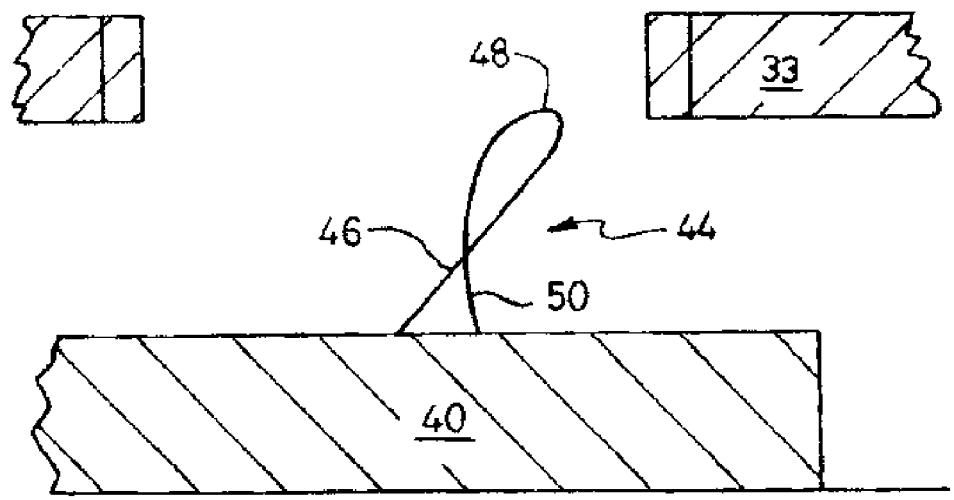
FIG. 4 is a detail of FIG. 3 showing the path of one of the secondary electrons.

The path described by one of the secondary electrons released from the sample 40 at an angle of 60° to the surface of the sample is shown in FIG. 4, denoted generally by reference numeral 44.

Although not immediately apparent in FIG. 4, the path 44 described by the electron has components in each of three mutually perpendicular directions. The first direction (the x-direction) is parallel to the surface of the sample 40 and parallel to the plane of FIG. 4. The second direction (the y-direction) is parallel to the surface of the sample and perpendicular to the plane of FIG. 4. The third direction (the z-direction) is perpendicular to the surface of the sample and parallel to the plane of FIG. 4. These directions will be used throughout the remainder of this description.

For the purposes of this description, motion from left to right of the drawing figures is considered to be in the positive x-direction, motion into the plane of the drawing figures is considered to be in the positive y-direction and motion from top to bottom of the drawing figures is considered to be in the positive z-direction.

The path 44 of the electron consists of first, intermediate and final portions 46, 48 and 50, respectively. During the first portion 46 the electron is released from the surface of the sample and travels away from the sample 40 in the general direction of the pole piece 33, through the magnetic field. Motion of the electron through the magnetic field causes it to describe a spiral.

The first portion 46 of the path 44 therefore consists of a portion of a spiral that has components in the positive x- and negative y-directions and in the negative z-direction. The spiral is of relatively large but decreasing diameter as the electron travels from the relatively weak region of the magnetic field in the immediate vicinity of the sample 40 into the relatively strong region of the magnetic field in the immediate vicinity of the pole piece 33.

The magnitude of the component of the spiral in the positive x-direction is increased by the component of the electric field resulting from the voltage applied to the accelerating electrode 35 of the detector 34.

During the intermediate portion 48 the electron travels through the relatively strong region of the magnetic field, which causes it to describe a portion of a spiral of relatively small diameter, so that the path of the electron has a component in the negative z-direction at the beginning of the intermediate portion 46 and a component in the positive z-direction at the end of the intermediate portion. Throughout the intermediate portion, the path of the electron has a component in the negative y-direction.

The final portion 50 of the path 44 consists of a portion of a spiral that has components in the negative y- and positive z-directions. At the beginning of the final portion the path has a component in the negative x-direction but has a component in the positive x-direction by the end of the final portion because of the component of the electric field established by the accelerating electrode of the detector. The portion of the spiral is of relatively large and increasing diameter as the electron travels out of the relatively strong region of the magnetic field into the relatively weak region. At the end of the final portion 50 the electron collides with the sample 40 at a point on the surface of the sample a small distance in the positive x-direction and negative y-direction from the point from which the electron was released at the beginning of the initial portion 46. The electron is therefore not detected by the detector 34.

Figure 5:
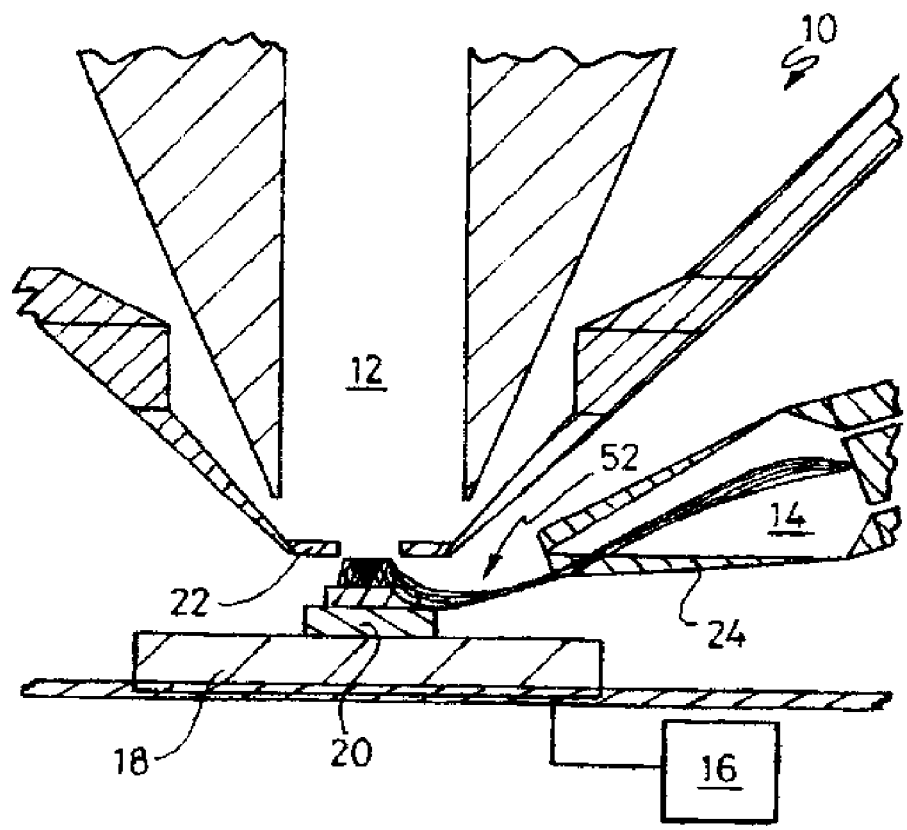
FIG. 5 is a partial schematic sectional view of the SEM of FIG. 2 in use with a beam of primary electrons with a kinetic energy of approximately 1 keV and a voltage of +2V applied by a further voltage source to a sample holder on which a sample rests, and shows the paths of secondary electrons released from the sample at an angle of 60° to the surface of the sample.

Turning to FIG. 5, this shows the SEM of FIG. 2 in use under similar conditions to the known SEM of FIGS. 3 and 4, namely with a beam constituted by primary electrons with a kinetic energy of approximately 1 keV. Again, for the purpose of clarity, only those secondary electrons released from the sample at an angle of 60° to the surface of the sample are shown in FIG. 5. However, in FIG. 5 a voltage of +2V has been applied to the sample holder 18 of the SEM by the further voltage source 16. Some of the secondary electrons released at an angle of 60° to the surface of the sample, the electrons being denoted generally by reference numeral 52, are prevented by the resulting component of the electric field from colliding with the sample or the pole piece 22 of the objective lens of the column 12, and therefore reach the detector 14.

Figure 6:
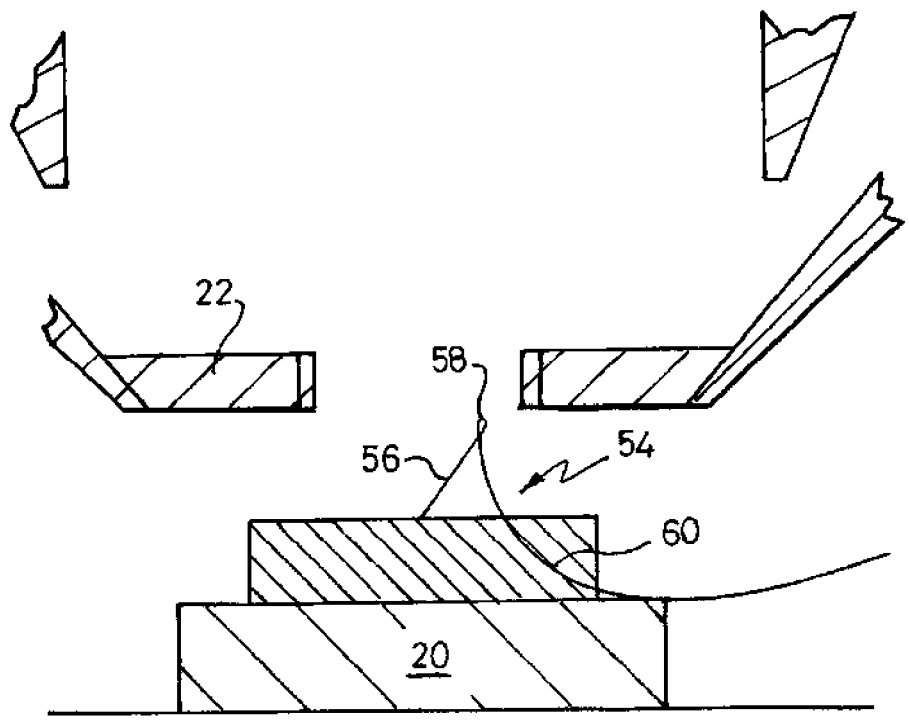
FIG. 6 is a detail of FIG. 5 showing the path of one of the secondary electrons.

The path described by one of the secondary electrons released from the sample 20 at an angle of 60° to the surface of the sample is shown in FIG. 6, denoted generally by reference numeral 54.

The path 54 of the electron consists of first, intermediate and final portions 56, 58 and 60, respectively. The first portion 56 consists of a portion of a spiral that has components in the positive x- and negative y-directions and in the negative z-direction. The magnitude of the component in the negative z-direction is reduced, compared with that of the electron shown in FIG. 4, by the component of the electric field resulting from the +2V voltage applied to the sample holder 18.

During the intermediate portion 58, therefore, the electron is moving more slowly than the electron shown in FIG. 4, and the diameter of the spiral described by the electron is smaller than that described by the electron shown in FIG. 4, because, for a particular strength of magnetic field the diameter of the spiral described by the electron is proportional to its speed. By the end of the intermediate portion 58, the path of the electron has a relatively large component in the negative y-direction and a relatively small component in the positive z-direction.

During the final portion 60 of the path 54 the electron describes a portion of a spiral of relatively large and increasing diameter as it travels out of the relatively strong region of the magnetic field. During the portion of the spiral the component in the negative y-direction remains greater than the component in the positive z-direction so that when the electron reaches the plane of the surface of the sample, it has traveled sufficiently far in the negative y-direction to avoid colliding with the surface of the sample. As the electron travels in the positive z-direction past the sample, the effect of the magnetic field decreases and the diameter of the portion of the spiral increases. The component of the electric field due to the accelerating electrode of the detector causes the electron to be drawn in the positive x-direction until at the end of the final portion 60 it reaches the detector 14.

Figure 7:
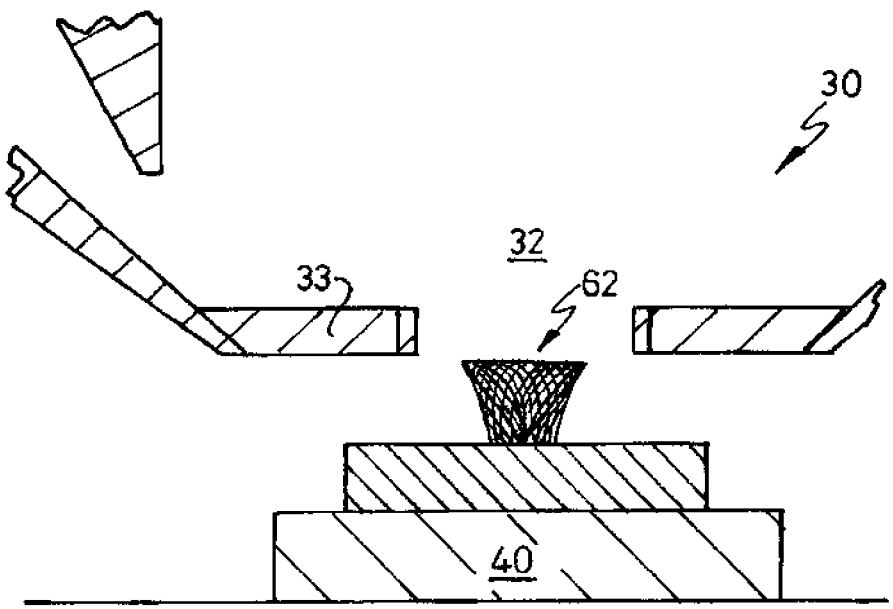
FIG. 7 is a partial schematic sectional view of the known SEM of FIG. 3 in use with a beam of primary electrons with a kinetic energy of approximately 30 keV and shows the paths of secondary electrons released from the sample at an angle of 45° to the surface of the sample.

FIG. 7 shows the paths of secondary electrons released from the sample 40 in the known SEM at an angle of 45° to the surface of the sample by a beam constituted by primary electrons with a kinetic energy of approximately 30 keV. The paths of the secondary electrons are denoted generally by reference numeral 62 and it can be seen that in the known SEM, none of the secondary electrons released at an angle of 45° to the surface of the sample reaches the detector, but all instead collide with the sample.

Figure 8:
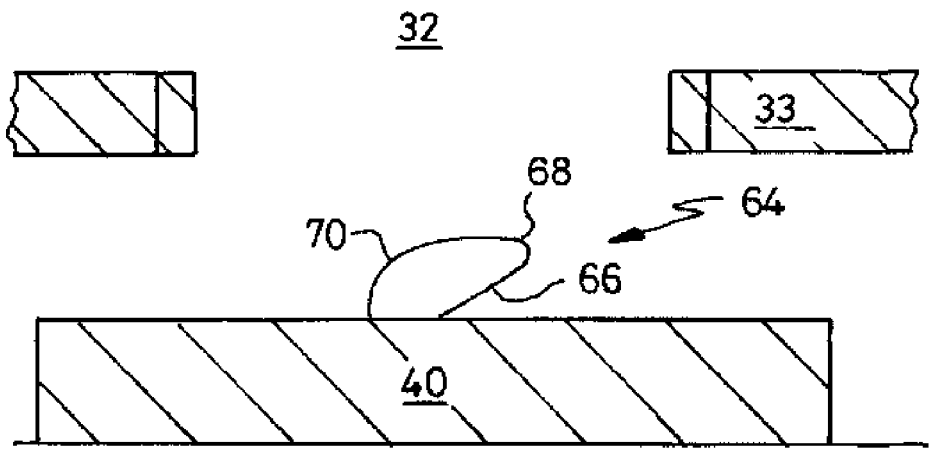
FIG. 8 is a detail of FIG. 7 showing the path of one of the secondary electrons.

The path described by one of the secondary electrons released from the sample 40 at an angle of 45° to the surface of the sample is shown in FIG. 8, denoted generally by reference numeral 64.

The path 64 consists of first, intermediate and final portions 66, 68 and 70, respectively. During the first portion 66 the electron is released from the surface of the sample and travels away from the sample 40 in the general direction of the pole piece 33, through the magnetic field in the immediate vicinity of the sample 40. Although the strength of the magnetic field in the immediate vicinity of the sample is less than that of the magnetic field in the immediate vicinity of the pole piece 33, the strength of the magnetic field in the immediate vicinity of the sample is relatively high in comparison with the strength of the magnetic field when the SEM is used with a beam constituted by primary electrons with a kinetic energy of approximately 1 keV.

During the initial portion 66 of the path 64, therefore, the electron describes a portion of a spiral with a relatively small diameter. The portion of the spiral has components in the positive x- and negative y-directions, and a component in the negative z-direction. During the intermediate portion 68 the electron changes direction so that the path of the electron has a component in the positive x-direction at the beginning of the intermediate portion and a component in the negative x-direction at the end of the intermediate portion.

The final portion 70 of the path 64 consists of a portion of a spiral that has components in the negative y- and x-directions and positive z-direction. At the end of the final portion the electron collides with the sample 40 at a point on the surface of the sample a small distance in the negative x- and y-directions from the point from which the electron was released at the beginning of the initial portion 66. The electron is not detected by the detector 34.

FIG. 9 shows the SEM of FIG. 2 in use under similar conditions to the known SEM of FIGS. 7 and 8, namely with a beam constituted by primary electrons with a kinetic energy of approximately 30 keV. Only those secondary electrons released from the sample at an angle of 45° to the surface of the sample are shown in FIG. 9. However, in FIG. 9 a voltage of −20V has been applied to the sample holder 18 by the further voltage source 16. Some of the secondary electrons released at an angle of 45° to the surface of the sample, the electrons being denoted generally by reference numeral 72, are prevented by the resulting component of the electric field from colliding with the sample or the pole piece 22 of the objective lens of the column 12, and therefore reach the detector 14.

The path described by one of the secondary electrons released from the sample 20 at an angle of 45° to the surface of the sample is shown in FIG. 10, denoted generally by reference numeral 74.

The path 74 of the electron consists of first, intermediate and final portions 76, 78 and 80, respectively. The first portion 76 consists of a spiral that has components, at various times, in both the positive and negative x- and y-directions, but only in the negative z-direction as the electron travels away from the sample towards the pole piece 22 of the column. The diameter of the spiral decreases from the beginning to the end of the first portion 76 as the electron travels from the relatively weak region to the relatively strong region of the magnetic field.

At the end of the initial portion 76 of the path 74 the electron has almost entered the aperture of the pole piece where it is subjected to a strong magnetic field due to the primary electrons that constitute the beam. The magnetic field changes the component of the path of the electron in the negative z-direction to a component in the positive z-direction.

During the intermediate portion 78 of the path 74 the electron describes a portion of a spiral of increasing diameter as it travels away from the pole piece 22 towards the sample 20 and from the relatively strong to the relatively weak region of the magnetic field. At the same time, the component of the path of the electron in the positive x-direction increases due to the component of the electric field established by the voltage applied to the accelerating electrode of the detector 14. At the end of the intermediate portion 78 the path of the electron has components in the positive z- and x-directions and is in the immediate vicinity of the sample.

The component of the electric field in the immediate vicinity of the sample due to the −20V voltage applied to the sample holder 18 changes the component of the path of the electron in the positive z-direction to a component in the negative z-direction. During the final portion 80 of the path 74 the electron travels a sufficient distance in the positive x-direction from the point at which it was released from the surface of the sample at the beginning of the initial portion 76 that the effect of the component of the electric field due to the accelerating electrode of the detector is much greater than that of the magnetic field.

The final portion 80 of the path 74 is therefore substantially linear in the positive x- and z-directions and at the end of the final portion the electron reaches the detector 14 and is detected.

It will be appreciated that the foregoing description relates only to two embodiments of the invention and that the invention encompasses other embodiments as defined by the foregoing statements of the invention.

The invention claimed is:

1. A charged particle beam instrument comprising a charged particle optical column, a voltage source, a detector and a sample holder, the column being operable to direct a beam of primary charged particles at a sample on the sample holder to cause secondary charged particles to be released from the sample, the voltage source being operable to establish in the vicinity of the sample an electric field that has a component that draws the secondary charged particles towards the detector, and the detector being operable to detect secondary charged particles, wherein the instrument further comprises a further voltage source variable between a first voltage that establishes a component of the electric field that draws the secondary charged particles away from the sample, so as to prevent at least some of them from colliding with the sample or sample holder, and a second voltage that establishes a component of the electric field that draws the secondary charged particles towards the sample, so as to prevent at least some of them from colliding with the column, thereby increasing the number of secondary charged particles detected by the detector.

2. An instrument according to claim 1, wherein the charged particle optical column is an electron optical column.

3. An instrument according to claim 1, wherein the instrument is a scanning electron microscope (SEM) of which the charged particle optical column is an electron optical column operable to direct a beam of primary electrons at the sample to cause secondary electrons to be released from the sample.

4. An instrument according to claim 1, wherein the detector is operable to detect some of the secondary charged particles by responding to photons that collide with it, the photons being generated as a result of collisions between some of the secondary charged particles and gas molecules between the sample holder and the detector.

5. An instrument according to claim 1, wherein the detector is operable to detect some of the secondary charged particles by responding to those of the secondary charged particles that collide with it.

6. An instrument according to claim 1, wherein the detector is an Everhart-Thornley detector.

7. An instrument according to claim 1, wherein the further voltage source is continuously variable between the first and second voltages.

8. An instrument according to claim 7, wherein the instrument includes a controller operable to vary the voltage of the further voltage source between the first and second voltages so as to maximise an output of the detector.

9. An instrument according to claim 1, wherein the further voltage source is variable over a range of 50V.

10. An instrument according to claim 1, wherein the further voltage source is connected to an electrode located between an objective lens of the column and the sample holder.

11. An instrument according to claim 10, wherein the electrode is formed with an aperture and is located relative to the objective lens such that the beam of primary charged particles may be directed through the electrode at the sample.

12. An instrument according to claim 11, wherein the aperture is substantially circular and the electrode is located relative to the objective lens such that the optical axis of the column passes through the centre of the aperture.

13. An instrument according to claim 1, wherein the further voltage source is connected to an objective lens of the column and/or the sample holder.

14. An instrument according to claim 13, wherein the further voltage source is connected to the sample holder and the objective lens is connected to electrical ground.

15. An instrument according to claim 14, wherein the further voltage source is variable between +25V and −25V.

16. A method of detecting charged particles, the method comprising the steps of directing a beam of primary charged particles from a charged particle optical column at a sample to cause secondary charged particles to be released from the sample, establishing in the vicinity of the sample an electric field that has a component that draws the secondary charged particles towards a detector, and detecting at least some of the secondary charged particles by means of the detector, wherein the method further comprises the step of increasing the number of secondary charged particles detected by the detector by establishing a component of the electric field that draws the secondary charged particles towards the sample, so as to prevent at least some of them from colliding with the column.

17. A method of detecting charged particles, the method comprising the steps of directing a beam of primary charged particles from a charged particle optical column at a sample to cause secondary charged particles to be released from the sample, establishing in the vicinity of the sample an electric field that has a component that draws the secondary charged particles towards a detector, and detecting at least some of the secondary charged particles by means of the detector, wherein the method further comprises the step of increasing the number of secondary charged particles detected by the detector by establishing a component of the electric field that draws the secondary charged particles away from the sample in the event that the behavior of the secondary charged particles is determined predominantly by a magnetic field of an objective lens of the column, and by establishing a component of the electric field that draws the secondary charged particles towards the sample where the behavior of the secondary charged particles is determined predominantly by the electric field, so as to prevent at least some of them from colliding with the column.

18. A method of detecting charged particles, the method comprising the steps of directing a beam of primary charged particles from a charged particle optical column at a sample to cause secondary charged particles to be released from the sample, establishing in the vicinity of the sample an electric field that has a component that draws the secondary charged particles towards a detector, and detecting at least some of the secondary charged particles by means of the detector, wherein the method further comprises the step of increasing the number of secondary charged particles detected by the detector by establishing a component of the electric field, selected from a first possible component that draws the secondary charged particles away from the sample, so as to prevent at least some of them from colliding with the sample, and a second possible component that draws the secondary charged particles towards the sample, so as to prevent at least some of them from colliding with the column, wherein the step of selecting the component from said possible components comprises determining the magnitude and direction of the component, that will achieve said increase, according to an angle or range of angles to the surface of the sample at which at least some of the secondary charged particles are released, to a kinetic energy of the primary charged particles of the beam and/or to a kinetic energy or range of kinetic energies of the secondary charged particles.

* * * * *